US009214490B2

(12) United States Patent
Yamaoka

(10) Patent No.: US 9,214,490 B2
(45) Date of Patent: Dec. 15, 2015

(54) SOLID-STATE IMAGING DEVICE

(71) Applicant: KABUSHIKI KAISHA TOSHIBA, Tokyo (JP)

(72) Inventor: Hiroaki Yamaoka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/195,775

(22) Filed: Mar. 3, 2014

(65) Prior Publication Data

US 2015/0062396 A1 Mar. 5, 2015

(30) Foreign Application Priority Data

Aug. 29, 2013 (JP) .................................. 2013-178521

(51) Int. Cl.
*H04N 3/14* (2006.01)
*H04N 5/335* (2011.01)
*H01L 27/00* (2006.01)
*H01L 27/146* (2006.01)

(52) U.S. Cl.
CPC .... *H01L 27/14643* (2013.01); *H01L 27/14603* (2013.01)

(58) Field of Classification Search
CPC ................ H04N 5/369–5/378; H04N 5/3745; H04N 5/37455; H04N 5/374; H01L 27/146–27/14893
USPC ................ 348/300, 302; 250/208.1; 345/212
See application file for complete search history.

(56) References Cited

U.S. PATENT DOCUMENTS

| 2006/0071252 A1* | 4/2006 | Kondo ........................ 257/291 |
| 2008/0007638 A1* | 1/2008 | Aoki et al. .................. 348/294 |
| 2008/0258042 A1* | 10/2008 | Krymski .................. 250/208.1 |
| 2009/0046190 A1* | 2/2009 | Matsumoto .................. 348/308 |
| 2010/0066879 A1* | 3/2010 | Tanaka ........................ 348/300 |
| 2011/0128426 A1* | 6/2011 | Taruki et al. ................ 348/300 |
| 2013/0001403 A1* | 1/2013 | Yamakawa ................ 250/208.1 |

FOREIGN PATENT DOCUMENTS

| JP | 2011082769 A | 4/2011 |
| JP | 2011114843 A | 6/2011 |

OTHER PUBLICATIONS

Korean Office Action dated Apr. 17, 2015, filed in Korean counterpart Application No. 10-2014-59048, 11 pages (with translation).

* cited by examiner

*Primary Examiner* — Sinh Tran
*Assistant Examiner* — Xi Wang
(74) *Attorney, Agent, or Firm* — Patterson & Sheridan, LLP

(57) ABSTRACT

According to one embodiment, there is provided a solid-state imaging device in which vertical signal lines VL1-1, VL1-2, VL2-1, VL2-2, VL3-1, and VL3-2 are respectively arranged between power lines DL1-1, DL1-3, DL2-1, DL2-3, DL3-1, and DL3-3, power lines DL1-2, DL2-2, and DL3-2 are respectively arranged between the vertical signal lines VL1-1, VL1-2, VL2-1, VL2-2, VL3-1, and VL3-2, power lines DL1-1 and DL1-3 are arranged to cross each other in each pixel in the column direction, power lines DL2-1 and DL2-3 are arranged to cross each other in each pixel in the column direction, and power lines DL3-1 and DL3-3 are arranged to cross each other in each pixel in the column direction.

17 Claims, 8 Drawing Sheets

SOLID-STATE IMAGING DEVICE

CROSS-REFERENCE TO RELATED APPLICATION

This application is based upon and claims the benefit of priority from Japanese Patent Application No. 2013-178521, filed Aug. 29, 2013, the entire contents of which are incorporated herein by reference.

FIELD

Embodiments described herein relate generally to a solid-state imaging device.

BACKGROUND

In a solid-state imaging device, reducing the time taken in image processing such as an A/D conversion is needed for a high frame rate, an increase in the number of pixels, and an increase in the number of output bits. In order to meet such a demand, a method of performing an A/D conversion in multiple column AD conversion circuits by providing multiple vertical signal lines which transmit pixel signals in the vertical direction has been proposed.

DETAILED DESCRIPTION

According to one embodiment, a solid-state imaging device includes a plurality of vertical signal lines in a single column wherein noise occurring on a vertical signal line that transmits pixel signals in the vertical direction is reduced.

In general, according to one embodiment, a solid-state imaging device includes a plurality of pixels that are arranged in a matrix having rows and columns, a plurality of horizontal controlling lines, each horizontal controlling line selecting pixels of a single row, a plurality n of vertical signal lines for each column of the pixels, wherein n is at least two and each of the n vertical signal lines of the same column is connected to a different group of pixels of the same column, and an analog-to-digital (AD) conversion circuit configured to perform AD conversions of pixel signals obtained from pixels selected by horizontal controlling lines and read through the vertical signal lines.

Hereinafter, a solid-state imaging device according to embodiments is described in detail with reference to accompanying drawings. In addition, an exemplary embodiment is not limited by these embodiments.

First Embodiment

Figure 1:
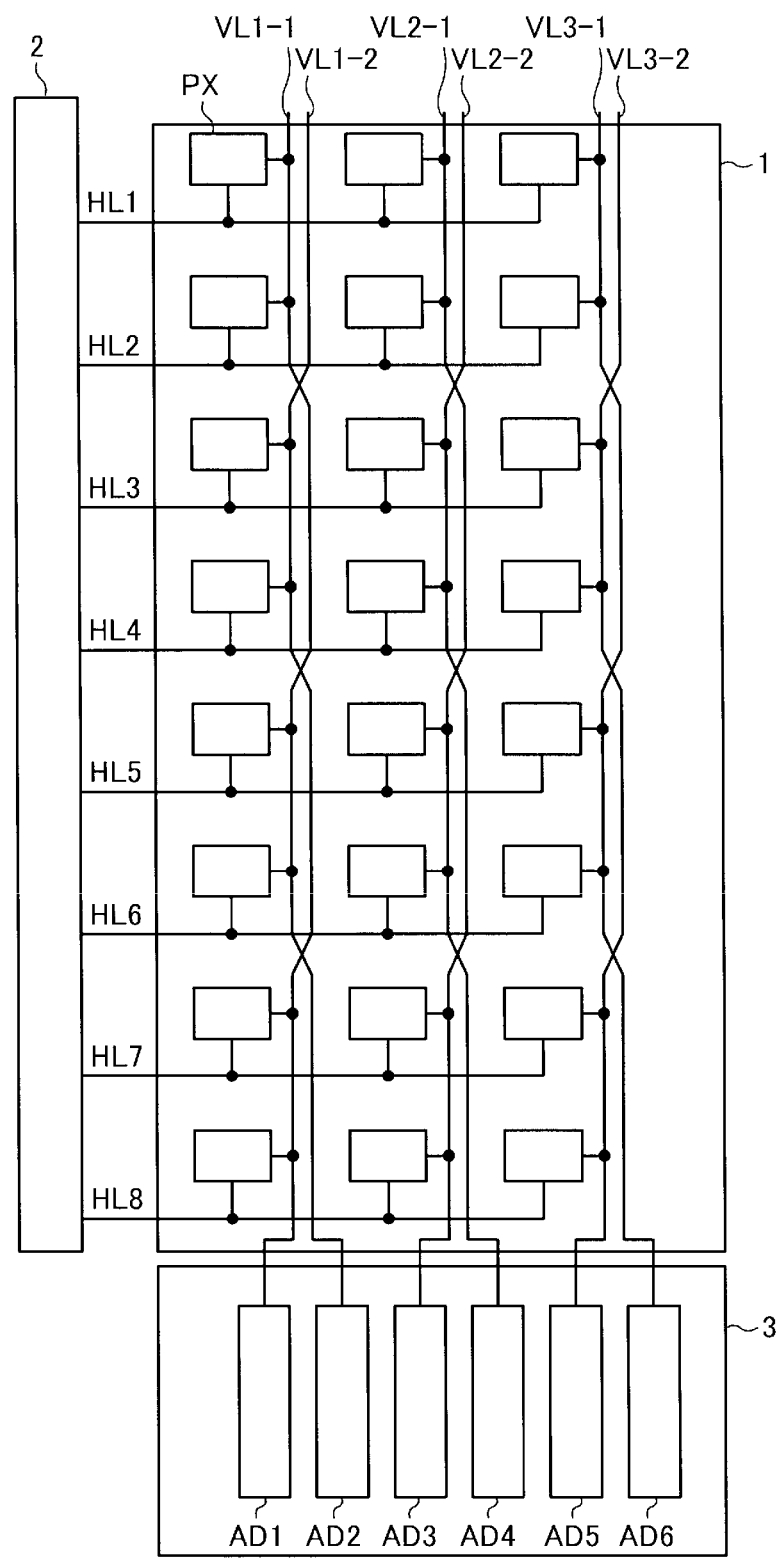
FIG. 1 is a block diagram which illustrates a schematic configuration of a solid-state imaging device according to a first embodiment.

FIG. 1 is a block diagram which illustrates a schematic configuration of a solid-state imaging device according to a first embodiment. In addition, FIG. 1 illustrates an example in which 3×8 pixels PX are arranged in a matrix in rows and columns.

In FIG. 1, a pixel array unit 1 is provided in the solid-state imaging device, and in the pixel array unit 1, pixels PX are arranged in a matrix in rows and columns. In addition, horizontal controlling lines HL1 to HL8 are arranged to select the pixels PX in the rows, and vertical signal lines VL1-1, VL1-2, VL2-1, VL2-2, VL3-1, and VL3-2 are arranged to transmit pixel signals that are read from the pixels PX in the columns. For example, the pixel array unit includes horizontal controlling lines HL1 to HL8 as reading lines which perform reading from the pixels PX, resetting lines which reset charges which are accumulated in the pixels PX, and address lines which perform row selections during reading.

The vertical signal lines VL1-1, VL1-2, VL2-1, VL2-2, VL3-1, and VL3-2 are arranged with two lines in each column. More particularly, the vertical signal lines VL1-1 and VL1-2 are arranged in the first column, the vertical signal lines VL2-1 and VL2-2 are arranged in the second column, and vertical signal lines VL3-1 and VL3-2 are arranged in the third column.

In addition, the vertical signal lines VL1-1, VL1-2, VL2-1, VL2-2, VL3-1, and VL3-2 are connected to every other two pixels of the pixels PX on the same column. For example, the vertical signal lines VL1-1, VL2-1, and VL3-1 are connected to pixels PX on the first, second, fifth, and sixth rows, and the vertical signal lines VL1-2, VL2-2, and VL3-2 are connected to pixels PX on the third, fourth, seventh, and eighth rows.

In addition, the vertical signal lines VL1-1 and VL1-2 are arranged to cross each other every two pixels in the column direction, the vertical signal lines VL2-1 and VL2-2 are arranged to cross each other every two pixels in the column direction, and the vertical signal lines VL3-1 and VL3-2 are arranged to cross each other every two pixels in the column direction.

In addition, in the solid-state imaging device, an AD conversion circuit 3 performs an AD conversion of pixel signals which are read through a vertical scanning circuit 2, which selects the horizontal controlling lines HL1 to HL8, and read through the vertical signal lines VL1-1, VL1-2, VL2-1, VL2-2, VL3-1, and VL3-2.

In the embodiment, the vertical scanning circuit 2 selects the horizontal controlling lines HL1 to HL8 so that pixel signals are simultaneously read in two vertical signal lines of VL1-1 and VL1-2, of VL2-1 and VL2-2, and of VL3-1 and VL3-2 in each column from two pixels which are connected to different vertical signal lines VL1-1 and VL1-2, VL2-1 and VL2-2, and VL3-1 and VL3-2 on the same column. More particularly, when signals are read in the vertical signal lines VL1-1, VL2-1, and VL3-1 from the pixels PX on the first row, and at the same time signals are read in the vertical signal lines VL1-2, VL2-2, and VL3-2 from the pixels PX on the third row, the vertical scanning circuit 2 selects the horizontal controlling lines HL1 and HL3 at the same time, and transmits the signals to the AD conversion circuit 3. In addition, the vertical scanning circuit 2 causes the vertical signal lines VL1-1, VL2-1, and VL3-1 to read signals from pixels PX on the second row, and causes the vertical signal lines VL1-2, VL2-2, and VL3-2 to read signals from pixels PX on the fourth row by selecting the horizontal controlling lines HL2 and HL4 at the same time after selecting the horizontal controlling lines HL1 and HL3 at the same time.

The AD conversion circuit 3 is provided with column AD converters AD1 to AD6 connected to each of vertical signal lines VL1-1, VL1-2, VL2-1, VL2-2, VL3-1, and VL3-2. In addition, the column AD converters AD1 to AD6 process pixel signals that are read in each of the vertical signal lines VL1-1, VL1-2, VL2-1, VL2-2, VL3-1, and VL3-2 at the same time.

It is possible to improve symmetry of the vertical signal lines VL1-1, VL1-2, VL2-1, VL2-2, VL3-1, and VL3-2 with respect to pixels PX on both sides while reducing the number of crossings of the vertical signal lines VL1-1, VL1-2, VL2-1, VL2-2, VL3-1, and VL3-2 in each column, by arranging the vertical signal lines VL1-1, VL1-2, VL2-1, VL2-2, VL3-1, and VL3-2 to cross every two pixels in the column direction. For this reason, crosstalk noise, which is superposed from each pixel PX, is reduced along with parasitic resistance and parasitic capacitance of the vertical signal lines VL1-1, VL1-2, VL2-1, VL2-2, VL3-1, and VL3-2, thereby reducing horizontal line noise which appears on an image while increasing reading speed.

Figure 2:
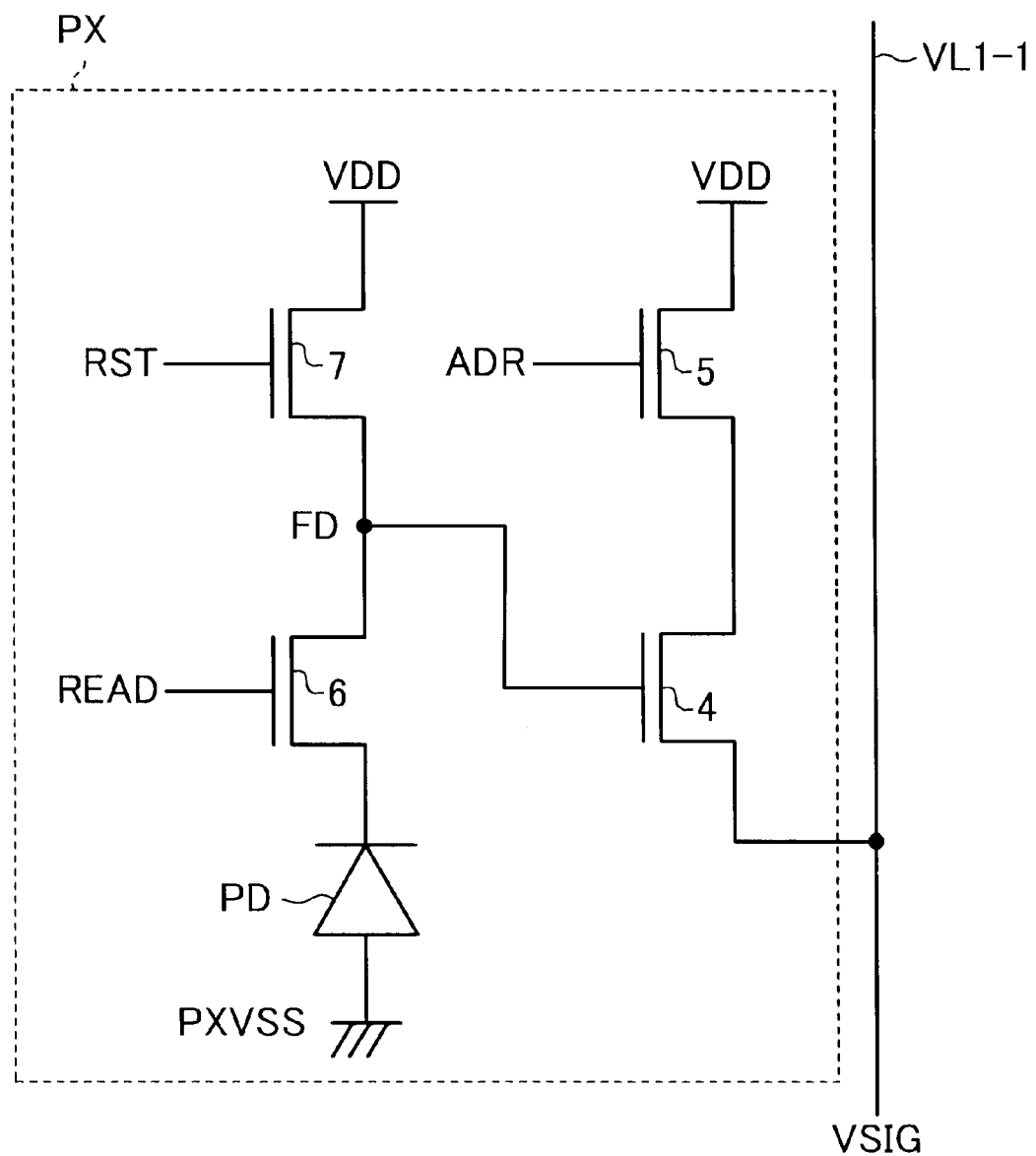
FIG. 2 is a circuit diagram which illustrates a schematic configuration of pixels in FIG. 1.

FIG. 2 is a circuit diagram which illustrates a schematic configuration of a pixel in FIG. 1.

In FIG. 2, a pixel PX includes a reading transistor 6, a resetting transistor 7, an addressing transistor 5, an amplifying transistor 4, a photodiode PD, and a floating diffusion FD.

In addition, a source of the reading transistor 6 is connected to the photodiode PD, and a gate of the reading transistor 6 is connected to a read line READ. In addition, a source of the resetting transistor 7 is connected to a drain of the reading transistor 6, a gate of the resetting transistor 7 is connected to a resetting line RST, and a drain of the resetting transistor 7 is connected to a power-supply potential VDD. In addition, a gate of the addressing transistor 5 is connected to an address line ADR, a drain of the addressing transistor 5 is connected to the power-supply potential VDD, and a source of the addressing transistor 5 is connected to a drain of the amplifying transistor 4. In addition, a gate of the amplifying transistor 4 is connected to a drain of the reading transistor 6, and a source of the amplifying transistor 4 is connected to a vertical signal line VL1-1. In this arrangement, the floating diffusion FD is formed at a connection point of the gate of the amplifying transistor 4 and the drain of the reading transistor 6. The anode of the photodiode PD is connected to a reference potential PXVSS. In addition, the reference potential PXVSS may be a ground potential, or a fixed potential that is lower than the power-supply potential VDD.

In addition, when the address line ADR is a low level, the addressing transistor 5 is in an OFF state, and a pixel signal VSIG is not transferred to the vertical signal line VL1-1. At this time, when the read line READ and the resetting line RST become high levels, the reading transistor 6 is turned on, and charge that was accumulated in the photodiode PD is discharged to the floating diffusion FD. In addition, the charge is discharged to the power-supply potential VDD through the resetting transistor 7.

When the read line READ becomes a low level after the charge accumulated in the photodiode PD has been discharged to the power-supply potential VDD, accumulation of signal charge is started in the photodiode PD.

Subsequently, when the address line ADR becomes a high level, the addressing transistor 7 is turned on, and the power-supply potential VDD is applied to the drain of the amplifying transistor 4.

In addition, when the resetting line RST becomes a high level in a state in which the addressing transistor 5 is turned on, the resetting transistor 7 is turned on, and extra charge that is generated in as leakage current, or the like, is discharged to the floating diffusion FD. In addition, a voltage corresponding to the resetting level of the floating diffusion FD is applied to the gate of the amplifying transistor 4, and a pixel signal VSIG at the resetting level is output to the vertical signal line VL1-1 which follows the voltage which is applied to the gate of the amplifying transistor 4.

In addition, the pixel signal VSIG at the resetting level is input to the column AD converter AD1, and is compared to a reference voltage. In addition, the pixel signal VSIG of the resetting level is converted into a digital value, and is maintained when a down-counting operation is performed based on a comparison result thereof.

Subsequently, when the read line READ becomes a high level in a state in which the addressing transistor 5 is turned on, the reading transistor 7 is turned on, and the charge that has accumulated in the photodiode PD is transmitted to the floating diffusion FD. In addition, when a voltage corresponding to a signal reading level of the floating diffusion FD is applied to the gate of the amplifying transistor 4, the voltage of the vertical signal line VL1-1 follows the voltage applied to the gate of the amplifying transistor 4, and a pixel signal VSIG of the signal level is output to the vertical signal line VL1-1.

The pixel signal VSIG of the signal level is then input to the column ADC converter AD1, and compared to the reference voltage. In addition, a difference between a pixel signal VSIG of a resetting level and the pixel signal VSIG of the signal level is converted into a digital value when an up-counting operation is performed based on a comparison result thereof.

Figure 3:
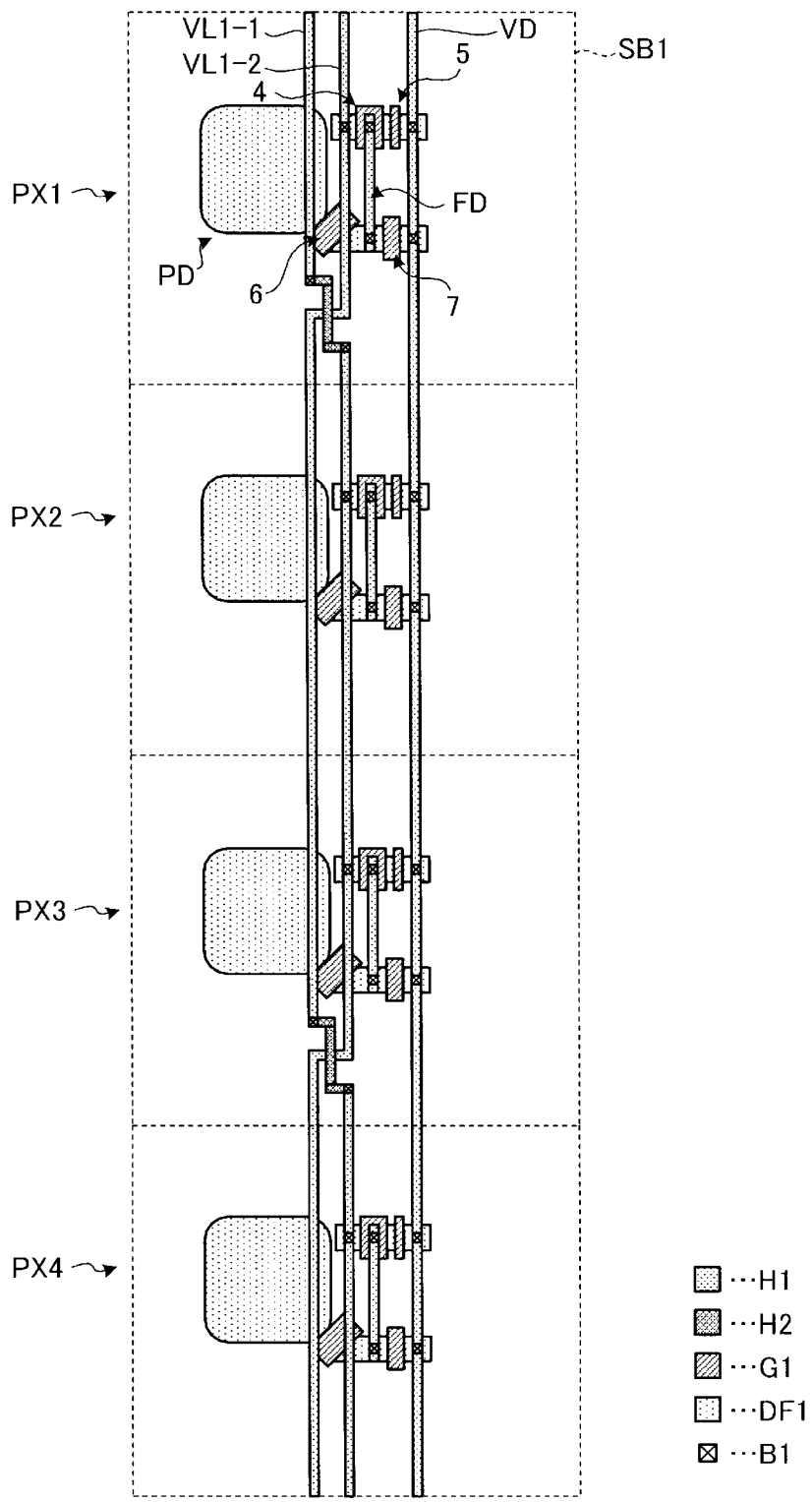
FIG. 3 is a plan view which illustrates a layout configuration of four pixels that are adjacent to each other in the column direction in FIG. 1.

FIG. 3 is a plan view which illustrates a layout configuration of four pixels which are adjacent to each other in the column direction in FIG. 1.

In FIG. 3, the photodiode PD is configured when respective diffusion layers DF1 are formed on a semiconductor substrate SB1 in the four pixels PX1 to PX4 which are adjacent to each other in the column direction. In addition, the reading transistor 6, the resetting transistor 7, the addressing transistor 5, and the amplifying transistor 4 are configured when gate electrodes G1 are respectively arranged on the semiconductor substrate SB1, and the diffusion layers DF1 are respectively provided on both sides of the gate electrodes G1. In addition, the floating diffusion FD is configured when the diffusion layer DF1 between a gate electrode G1 of the reading transistor 6 and a gate electrode G1 of the resetting transistor 7 is connected to a gate electrode G1 of the amplifying transistor 4 through via B1 and wiring H1.

In addition, the vertical signal lines VL1-1 and VL1-2 include two wirings H1 which are arranged adjacent to each other, and in a crossing position of the vertical signal lines VL1-1 and VL1-2, one of two wirings H1 is connected thereto, and the other is cut, and the cut portion is connected to wiring H2 through the via B1. In addition, it is possible to arrange the wirings H1 and H2 on wiring layers which are different from each other, and for example, it is possible to use a first wiring layer for the wiring H1, and use a second wiring layer for the wiring H2. In addition, cutting of the wiring H1 which is used in the vertical signal lines VL1-1 and VL1-2 at a crossing position may be performed every other two pixels with respect to the vertical signal lines VL1-1 and VL1-2.

In addition, it is preferable to make positions in the row direction of the wiring H1 after crossing the vertical signal lines VL1-1 and VL1-2 match each other, and to arrange the vertical signal line VL1-1 on a straight line between pixels PX1 to PX4 which are adjacent to each other with respect to the vertical signal line VL1-2. In addition, a power line VD includes the wiring H1, which is arranged to be adjacent to the vertical signal lines VL1-1 and VL1-2. The power line VD may supply the power-supply potential VDD to the pixels PX1 to PX4.

In addition, the wiring H1, which is used in the vertical signal line VL1-1, is connected to the diffusion layer DF1 on the source side of the amplifying transistor 4 of the pixels PX2 and PX3 through the via B1, and the wiring H1, which is used in the vertical signal line VL1-2, is connected to the diffusion layer DF1 on the source side of the amplifying transistor 4 of the pixels PX1 and PX4 through the via B1. In addition, the wiring H1, which is used in the power line VD, is connected to the diffusion layer DF1 on the drain side of the resetting transistor 2 of the pixels PX1 to PX4 through the via B1.

With this arrangement it is possible to secure symmetry of the vertical signal lines VL1-1 and VL1-2 by configuring the vertical signal lines VL1-1 and VL1-2 using the wiring H1, and the wiring H2 at the crossing position of the vertical signal lines VL1-1 and VL1-2, and to reduce crosstalk noise which is superposed from the pixels PX1 to PX4 and the power line VD.

In addition, it is possible to reduce the wiring length and the number of vias compared to the configuration in which the vertical signal lines are arranged to cross each other at every pixel, and to suppress an increase in parasitic resistance and parasitic capacitance of the vertical signal lines VL1-1 and VL1-2 by arranging the vertical signal lines VL1-1 and VL1-2 to cross each other every two pixels in the column direction.

In addition, in the above described first embodiment, a method of arranging two of the vertical signal lines VL1-1, VL1-2, VL2-1, VL2-2, VL3-1, and VL3-2 in each column is described, however, the vertical signal lines which are arranged in each column are not limited to two; n vertical signal lines, where n is an integer equal to or greater than 2, can be arranged in each column. In this case, it is possible to divide pixels PX in each column into n groups, and to connect the pixels PX to vertical signal lines, which are different in each group. For example, n pixels PX that are adjacent to each other in the column direction may be connected to vertical signal lines which are different from each other in each column. In addition, one vertical signal line in each column may cross n−1 vertical signal lines on the same column every m pixels (m is an integer equal to or greater than 2). In addition, pixels PX in each column may be connected to the same vertical signal line every (n−1)×m pixels in the column direction. In addition, it is possible to cause n vertical signal lines to read pixel signals at the same time from n pixels PX that belong to groups different from each other.

Second Embodiment

Figure 4:
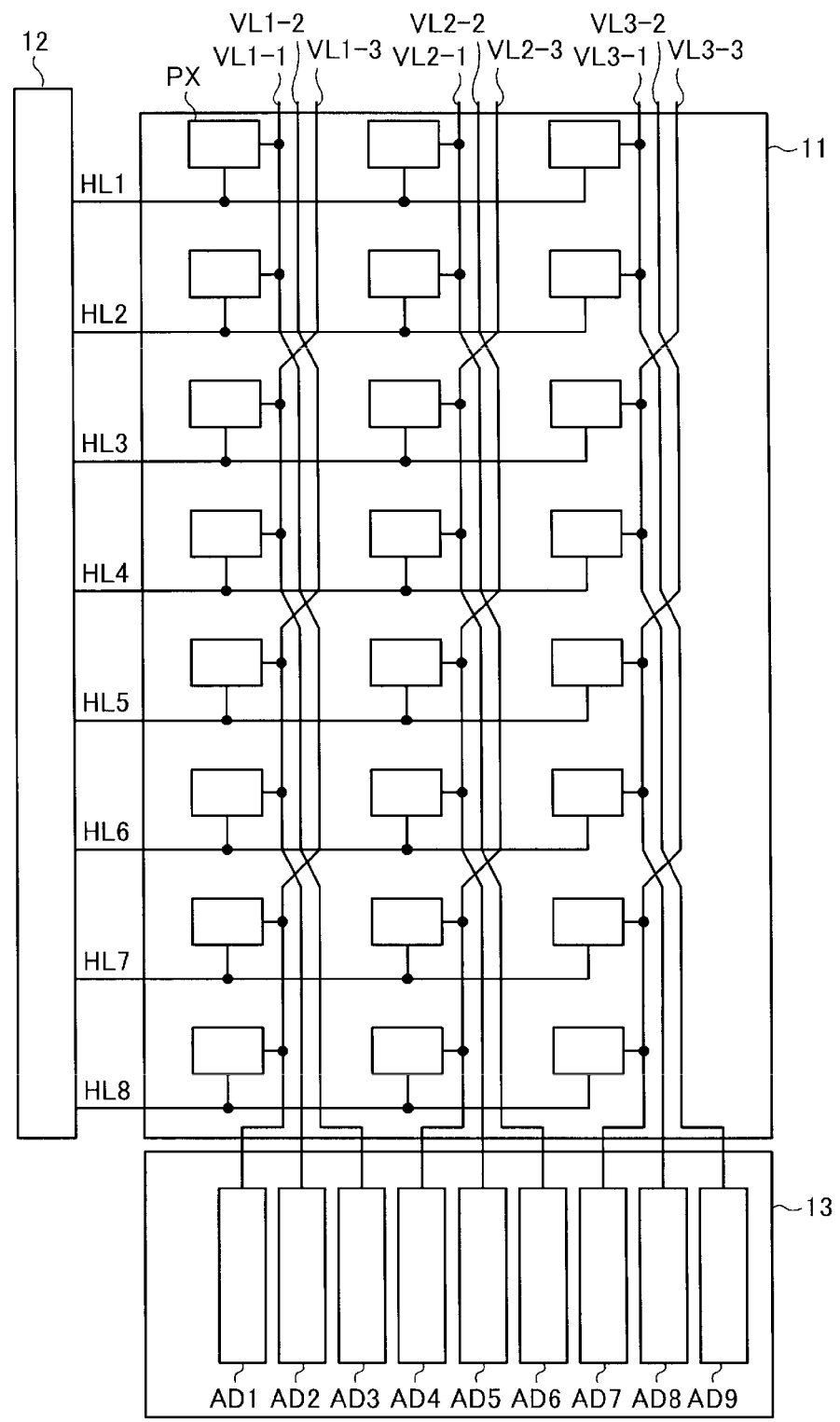
FIG. 4 is a block diagram which illustrates a schematic configuration of a solid-state imaging device according to a second embodiment.

FIG. 4 is a block diagram which illustrates a schematic configuration of a solid-state imaging device according to a second embodiment.

In FIG. 4, a pixel array unit 11 is provided in the solid-state imaging device, and pixels PX are arranged in a matrix having rows and columns in the pixel array unit 11. In addition, pixel array unit 11 includes horizontal controlling lines HL1 to HL8 that select pixels PX in a row, and vertical signal lines VL1-1 to VL1-3, VL2-1 to VL2-3, and VL3-1 to VL3-3 that transmit pixel signals in a column read from the pixels PX.

Three vertical signal lines VL1-1 to VL1-3, VL2-1 to VL2-3, and VL3-1 to VL3-3 are arranged in each column. More particularly, the vertical signal lines VL1-1 to VL1-3 are arranged on the first column, the vertical signal lines VL2-1 to VL2-3 are arranged on the second column, and the vertical signal lines VL3-1 to VL3-3 are arranged on the third column.

In addition, the vertical signal lines VL1-1 to VL1-3, VL2-1 to VL2-3, and VL3-1 to VL3-3 are connected to pixels PX on the same column every other two pixels. In particular, the vertical signal lines VL1-1, VL2-1, and VL3-1 are connected to pixels PX on the first, second, seventh, and eighth rows, the vertical signal lines VL1-2, VL2-2, and VL3-2 are connected to pixels PX on the fifth and sixth rows, and the vertical signal lines VL1-3, VL2-3, and VL3-3 are connected to pixels PX on the third and fourth rows.

In addition, the vertical signal lines VL1-1 to VL1-3 are arranged to cross each other every two pixels in the column, the vertical signal lines VL2-1 to VL2-3 are arranged to cross each other every two pixels in the column, and the vertical signal lines VL3-1 to VL3-3 are arranged to cross each other every two pixels in the column.

In addition, in the solid-state imaging device, an AD conversion circuit 13 is provided. The AD conversion circuit converts pixel signals that are read through a vertical scanning circuit 12 that selects horizontal controlling lines HL1 to HL8, and the vertical signal lines VL1-1 to VL1-3, VL2-1 to VL2-3, and VL3-1 to VL3-3.

In this arrangement, the vertical scanning circuit 12 selects the horizontal controlling lines HL1 to HL8 so that the pixel signals are read in the three vertical signal lines VL1-1 to VL1-3, VL2-1 to VL2-3, and VL3-1 to VL3-3 in each column at the same time from three pixels which are connected to different vertical signal lines VL1-1 to VL1-3, VL2-1 to VL2-3, and VL3-1 to VL3-3 on the same column. For example, when signals are read in the vertical signal lines VL1-1, VL2-1, and VL3-1 from pixels PX on the first row, signals are read in the vertical signal lines VL1-3, VL2-3, and VL3-3 from pixels PX on the third row, and signals are read in the vertical signal lines VL1-2, VL2-2, and VL3-2 from pixels PX on the fifth row, the vertical scanning circuit 12 selects the horizontal controlling lines HL1, HL3, and HL5 at the same time, and transmit the signals to the AD conversion circuit 13. In addition, the vertical scanning circuit 12 causes the vertical signal lines VL1-1, VL2-1, and VL3-1 to read signals from pixels PX on the second row, causes the vertical signal lines VL1-3, VL2-3, and VL3-3 to read signals from pixels PX on the fourth row, and causes the vertical signal lines VL1-2, VL2-2, and VL3-2 to read signals from pixels PX on the sixth row by selecting the horizontal controlling lines HL2, HL4, and HL6 at the same time, after selecting the horizontal controlling lines HL1, HL3, and HL5 at the same time.

Column AD converters AD1 to AD9 are provided for each of the vertical signal lines VL1-1 to VL1-3, VL2-1 to VL2-3, and VL3-1 to VL3-3 in the AD conversion circuit 13. In addition, the column AD converters AD1 to AD9 processes pixel signals which are respectively read in the vertical signal lines VL1-1 to VL1-3, VL2-1 to VL2-3, and VL3-1 to VL3-3 at the same time.

In FIG. 4, when the vertical signal lines VL1-1 to VL1-3, VL2-1 to VL2-3, and VL3-1 to VL3-3 are arranged to cross each other every two pixels in the column direction, it is possible to improve symmetry of the vertical signal lines VL1-1 to VL1-3, VL2-1 to VL2-3, and VL3-1 to VL3-3 with respect to pixels PX on both sides while reducing the number of crossings of the vertical signal lines VL1-1 to VL1-3, VL2-1 to VL2-3, and VL3-1 to VL3-3 in each column. For this reason, it is possible to reduce crosstalk noise which is superposed from each pixel PX while reducing parasitic resistance and parasitic capacitance of the vertical signal lines VL1-1 to VL1-3, VL2-1 to VL2-3, and VL3-1 to VL3-3, and thus to reduce horizontal line noise which appears on an image while speeding up a reading speed.

Third Embodiment

Figure 5:
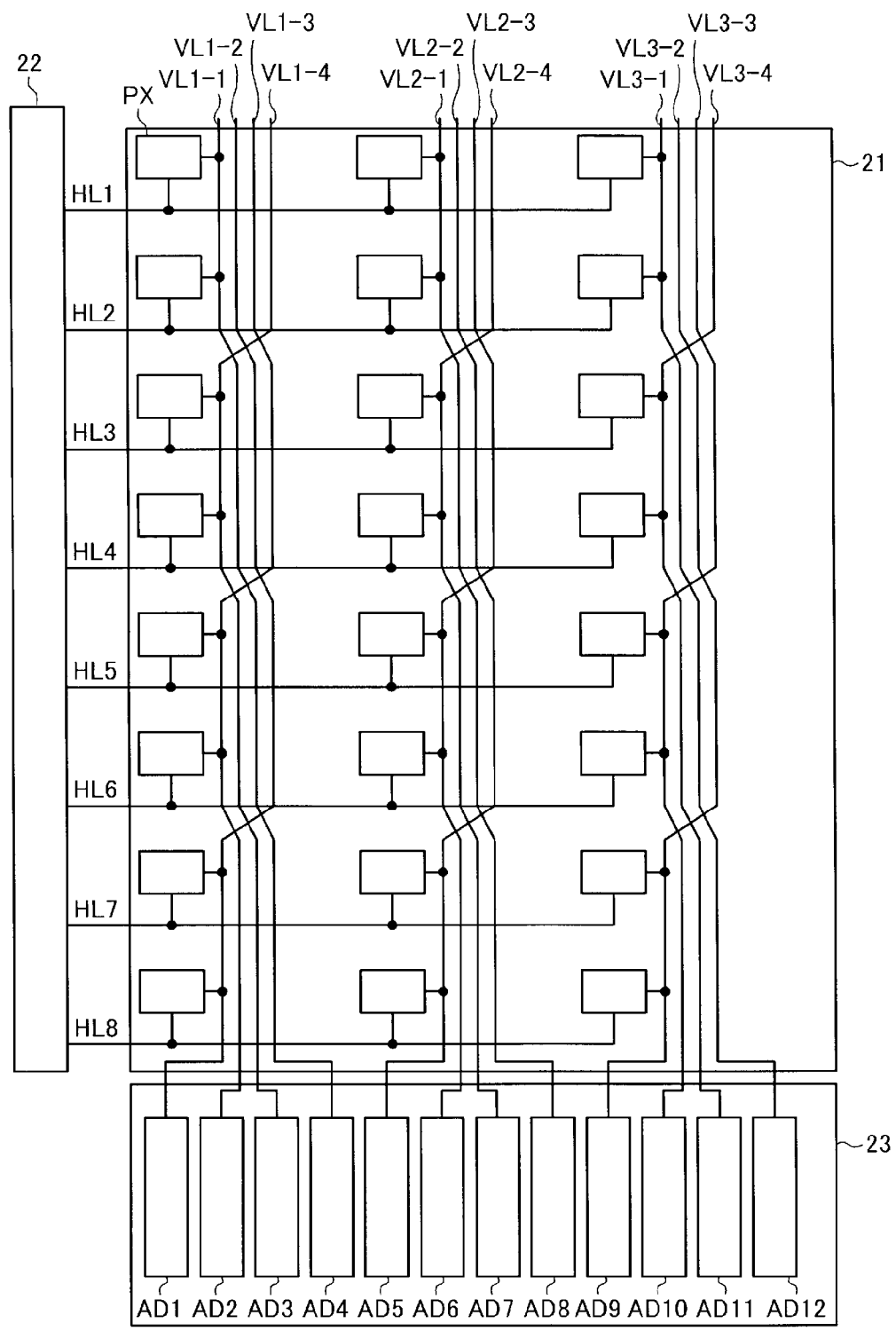
FIG. 5 is a block diagram which illustrates a schematic configuration of a solid-state imaging device according to a third embodiment.

FIG. 5 is a block diagram which illustrates a schematic configuration of a solid-state imaging device according to a third embodiment.

In FIG. 5, a pixel array unit 21 is provided in the solid-state imaging device, and pixels PX are arranged in a matrix having rows and columns in the pixel array unit 21. In addition, the pixel array unit 21 includes horizontal controlling lines HL1 to HL8 that select pixels PX in a row, and vertical signal lines VL1-1 to VL1-4, VL2-1 to VL2-4, and VL3-1 to VL3-4 that transmit pixel signals in the column that are read from the pixels PX.

Four vertical signal lines VL1-1 to VL1-4, VL2-1 to VL2-4, and VL3-1 to VL3-4 are arranged in each column. For example, the vertical signal lines VL1-1 to VL1-4 are arranged on the first column, the vertical signal lines VL2-1 to VL2-4 are arranged on the second column, and the vertical signal lines VL3-1 to VL3-4 are arranged on the third column.

In addition, the vertical signal lines VL1-1 to VL1-4, VL2-1 to VL2-4, and VL3-1 to VL3-4 are connected to pixels PX on the same column every other two pixels. For example, the vertical signal lines VL1-1, VL2-1, and VL3-1 are connected to pixels PX on the first and second rows, the vertical signal lines VL1-2, VL2-2, and VL3-2 are connected to pixels PX on the seventh and eighth rows, the vertical signal lines VL1-3, VL2-3, and VL3-3 are connected to pixels PX on the fifth and sixth row, and the vertical signal lines VL1-4, VL2-4, and VL3-4 are connected to pixels PX on the third and fourth rows.

In addition, the vertical signal lines VL1-1 to VL1-4 are arranged to cross each other every two pixels in the column, the vertical signal lines VL2-1 to VL2-4 are arranged to cross each other every two pixels in the column, and the vertical signal lines VL3-1 to VL3-4 are arranged to cross each other every two pixels in the column.

In addition, in the solid-state imaging device, an AD conversion circuit 23 is provided. The AD conversion circuit performs an AD conversion of pixel signals that are read through a vertical scanning circuit 22 that selects horizontal controlling lines HL1 to HL8 and the vertical signal lines VL1-1 to VL1-4, VL2-1 to VL2-4, and VL3-1 to VL3-4.

In FIG. 5, the vertical scanning circuit 22 selects the horizontal controlling lines HL1 to HL8 so that the pixel signals are read in the four vertical signal lines VL1-1 to VL1-4, VL2-1 to VL2-4, and VL3-1 to VL3-4 in each column at the same time from four pixels which are connected to different vertical signal lines VL1-1 to VL1-4, VL2-1 to VL2-4, and VL3-1 to VL3-4 on the same column. In particular, when signals are read in the vertical signal lines VL1-1, VL2-1, and VL3-1 from pixels PX on the first row, signals are read in the vertical signal lines VL1-4, VL2-4, and VL3-4 from pixels PX on the third row, signals are read in the vertical signal lines VL1-3, VL2-3, and VL3-3 from pixels PX on the fifth row, and signal are read in the vertical signal lines VL1-2, VL2-2, and VL3-2 from pixels PX on the seventh row, the vertical scanning circuit 22 selects the horizontal controlling lines HL1, HL3, HL5 and HL7 at the same time, and transmits the signals to the AD conversion circuit 23. In addition, the vertical scanning circuit 22 causes the vertical signal lines VL1-1, VL2-1, and VL3-1 to read signals from pixels PX on the second row, causes the vertical signal lines VL1-4, VL2-4, and VL3-4 to read signals from pixels PX on the fourth row, causes the vertical signal lines VL1-3, VL2-3, and VL3-3 to read signals from pixels PX on the sixth row, and causes the vertical signal lines VL1-2, VL2-2, and VL3-2 to read signals from pixels PX on the eighth row by selecting the horizontal controlling lines HL2, HL4, HL6, and HL8 at the same time, after selecting the horizontal controlling lines HL1, HL3, HL5, and HL7 at the same time.

In the AD conversion circuit 23, column AD converters AD1 to AD12 are provided in each of the vertical signal lines VL1-1 to VL1-4, VL2-1 to VL2-4, and VL3-1 to VL3-4. In addition, the column AD converters AD1 to AD12 process pixel signals which are respectively read in the vertical signal lines VL1-1 to VL1-4, VL2-1 to VL2-4, and VL3-1 to VL3-4 at the same time.

In FIG. 5, when the vertical signal lines VL1-1 to VL1-4, VL2-1 to VL2-4, and VL3-1 to VL3-4 are arranged to cross each other every two pixels in the column direction, it is possible to improve symmetry of the vertical signal lines VL1-1 to VL1-4, VL2-1 to VL2-4, and VL3-1 to VL3-4 with respect to pixels PX on both sides while reducing the number of crossings of the vertical signal lines VL1-1 to VL1-4, VL2-1 to VL2-4, and VL3-1 to VL3-4 in each column. For this reason, it is possible to reduce crosstalk noise which is superposed from each pixel PX while reducing parasitic resistance and parasitic capacitance of the vertical signal lines VL1-1 to VL1-4, VL2-1 to VL2-4, and VL3-1 to VL3-4, and thus to reduce horizontal line noise which appears on an image while speeding up a reading speed.

Fourth Embodiment

Figure 6:
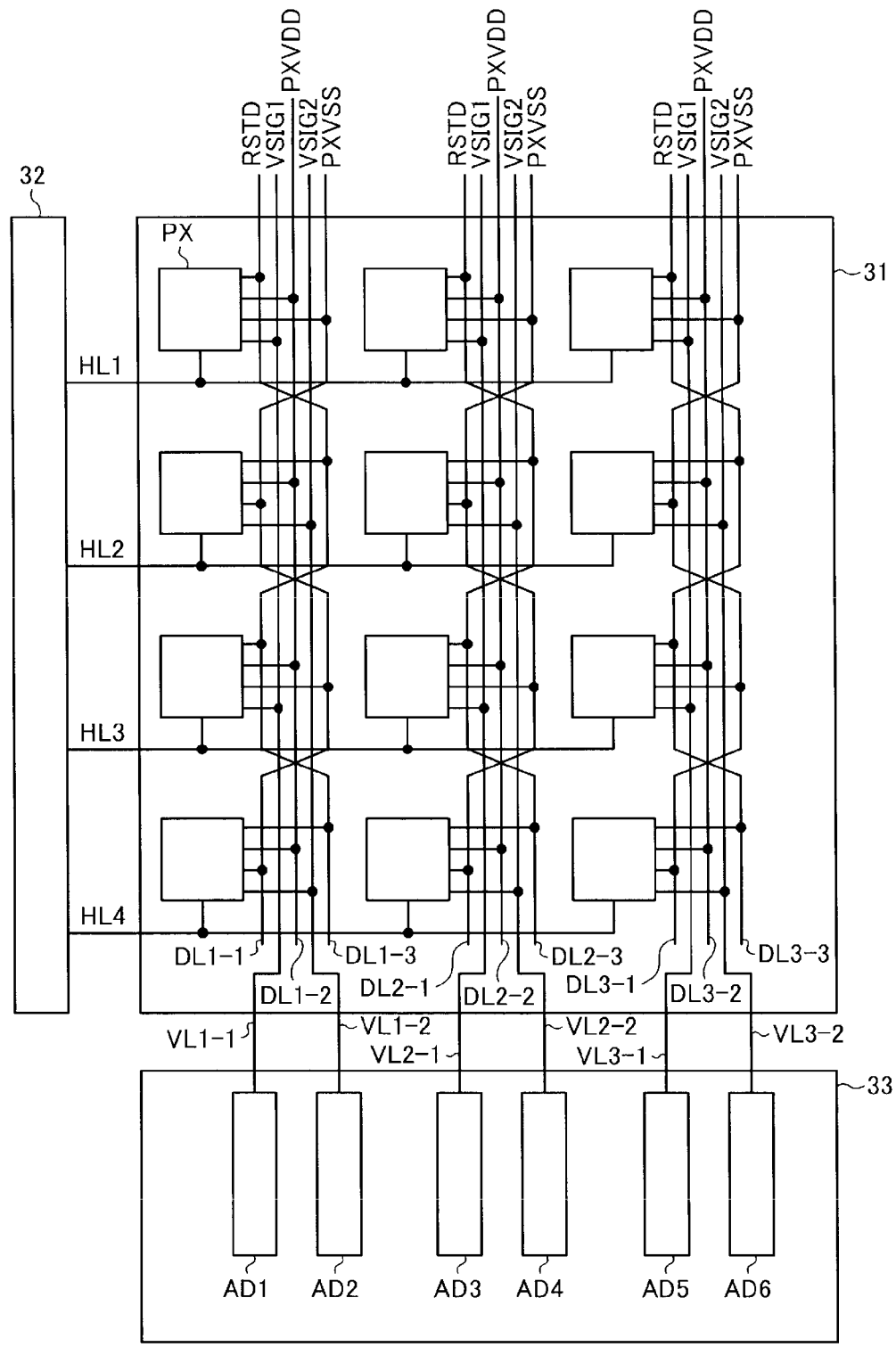
FIG. 6 is a block diagram which illustrates a schematic configuration of a solid-state imaging device according to a fourth embodiment.

FIG. 6 is a block diagram which illustrates a schematic configuration of a solid-state imaging device according to a fourth embodiment. In addition, in FIG. 6, an example in which 3×4 pixels PX are arranged in a matrix in the row and column directions is illustrated.

In FIG. 6, a pixel array unit 31 is provided in the solid-state imaging device, and pixels PX are arranged in a matrix with rows and columns in the pixel array unit 31. In addition, pixel array unit 31 includes horizontal controlling lines HL1 to HL4 that select pixels PX in the rows, and vertical signal lines VL1-1, VL1-2, VL2-1, VL2-2, VL3-1, and VL3-2 which transmit pixel signals that are read from the pixels PX in the columns.

Two of vertical signal lines VL1-1, VL1-2, VL2-1, VL2-2, VL3-1, and VL3-2 are arranged in each column; for example, the vertical signal lines VL1-1 and VL1-2 are arranged on the first column, the vertical signal lines VL2-1 and VL2-2 are arranged on the second column, and the vertical signal lines VL3-1 and VL3-2 are arranged on the third column.

In addition, the vertical signal lines VL1-1, VL1-2, VL2-1, VL2-2, VL3-1, and VL3-2 are connected to pixels PX on the same column every other pixel. That is, the vertical signal lines VL1-1, VL2-1, and VL3-1 are connected to pixels PX on the first and third rows, and the vertical signal lines VL1-2, VL2-2, and VL3-2 are connected to pixels PX on the second and fourth rows.

In addition, the pixel array unit 31 includes power lines DL1-1 to DL1-3, DL2-1 to DL2-3, and DL3-1 to DL3-3 which supply power to pixels PX. In addition, the power lines DL1-1, DL2-1, and DL3-1 are set to a reference potential PXVSS, power lines DL1-2, DL2-2, and DL3-2 are set to a second power-supply potential PXVDD, and power lines DL1-3, DL2-3, and DL3-3 are set to a first power-supply potential RSTD.

Three power lines DL1-1 to DL1-3, DL2-1 to DL2-3, and DL3-1 to DL3-3 are arranged in each column; for example, the power lines DL1-1 to DL1-3 are arranged on the first column, the power lines DL2-1 to DL2-3 are arranged on the second column, and the power lines DL3-1 to DL3-3 are arranged on the third column.

In addition, the vertical signal lines VL1-1, VL1-2, VL2-1, VL2-2, VL3-1, and VL3-2 are respectively arranged between the power lines DL1-1, DL1-3, DL2-1, DL2-3, DL3-1, and DL3-3, and the power lines DL1-2, DL2-2, and DL3-2 are respectively arranged between the vertical signal lines VL1-1, VL1-2, VL2-1, VL2-2, VL3-1, and VL3-2 in each column. In addition, the power lines DL1-1 to DL1-3 are arranged so as to cross each other between each pixel in the column, the power lines DL2-1 to DL2-3 are arranged to cross each other between each pixel in the column, and the power lines DL3-1 to DL3-3 are arranged to cross each other between each pixel in the column.

In addition, the solid-state imaging device includes a vertical scanning circuit 32 that selects horizontal controlling lines HL1 to HL4, and an AD conversion circuit 33 that performs an AD conversion of the pixel signal read through the vertical signal lines VL1-1, VL1-2, VL2-1, VL2-2, VL3-1, and VL3-2.

In FIG. 6, the vertical scanning circuit 32 selects the horizontal controlling lines HL1 to HL4 so that the pixel signals are read in the two vertical signal lines of VL1-1, VL1-2, VL2-1, VL2-2, VL3-1, and VL3-2 in each column at the same time from two pixels that are connected to different vertical signal lines of VL1-1, VL1-2, VL2-1, VL2-2, VL3-1, and VL3-2 on the same column. For example, when a pixel signal VSIG1 is read in the vertical signal lines VL1-1, VL2-1, and VL3-1 from pixels PX on the first row, and a pixel signal VSIG2 is read in the vertical signal lines VL1-2, VL2-2, and VL3-2 from pixels PX on the second row at the same time, the vertical scanning circuit 32 selects the horizontal controlling lines HL1 and HL2 at the same time, and transmits the signals to the AD conversion circuit 33. In addition, the vertical scanning circuit 32 causes the vertical signal lines VL1-1, VL2-1, and VL3-1 to read the pixel signal VSIG1 from pixels PX on the third row, and causes the vertical signal lines VL1-2, VL2-2, and VL3-2 to read the pixel signal VSIG2 from pixels PX on the fourth row at the same time, by selecting the horizontal controlling lines HL3 and HL4 at the same time, after selecting the horizontal controlling lines HL1 and HL2 at the same time.

In the AD conversion circuit 33, column AD converters AD1 to AD6 are provided in each of the vertical signal lines VL1-1, VL1-2, VL2-1, VL2-2, VL3-1, and VL3-2. In addition, the column AD converters AD1 to AD6 process the pixel signals VSIG1 and VSIG2 that are respectively read in the vertical signal lines VL1-1, VL1-2, VL2-1, VL2-2, VL3-1, and VL3-2 at the same time.

With this arrangement, it is possible to reduce crosstalk noise which is superposed on the vertical signal lines VL1-1, VL1-2, VL2-1, VL2-2, VL3-1, and VL3-2 from the power lines DL1-1, DL1-3, DL2-1, DL2-3, DL3-1, and DL3-3 without increasing the length of wiring of the vertical signal lines VL1-1, VL1-2, VL2-1, VL2-2, VL3-1, and VL3-2 by crossing the power lines DL1-1, DL1-3, DL2-1, DL2-3, DL3-1, and DL3-3 in each column. In addition, it is possible to reduce crosstalk noise which is superposed on the vertical signal lines VL1-1, VL1-2, VL2-1, VL2-2, VL3-1, and VL3-2 from each pixel PX by a shielding effect of the power lines DL1-1, DL1-3, DL2-1, DL2-3, DL3-1, and DL3-3 by respectively arranging the vertical signal lines VL1-1, VL1-2, VL2-1, VL2-2, VL3-1, and VL3-2 between the power lines DL1-1, DL1-3, DL2-1, DL2-3, DL3-1, and DL3-3 in each column. For this reason, it is possible to reduce a negative influence of crosstalk noise which is superposed on the vertical signal lines VL1-1, VL1-2, VL2-1, VL2-2, VL3-1, and VL3-2 while reducing parasitic resistance and parasitic capacitance of the vertical signal lines VL1-1, VL1-2, VL2-1, VL2-2, VL3-1, and VL3-2, and thus to reduce horizontal line noise which appears on an image while speeding up a reading operation.

In addition, in the example in FIG. 6, the configuration in which the power lines DL1-1, DL1-3, DL2-1, DL2-3, DL3-1, and DL3-3 are arranged to cross each other in every pixel in each column is illustrated, however, the power lines DL1-1, DL1-3, DL2-1, DL2-3, DL3-1, and DL3-3 may be arranged so as to cross each other every m pixels in the column direction.

In addition, in the example in FIG. 6, a method of setting the power lines DL1-1, DL2-1, and DL3-1 to the reference potential PXVSS, the power lines DL1-2, DL2-2, and DL3-2 to the second power-supply potential PXVDD, and the power lines DL1-3, DL2-3, and DL3-3 to the first power-supply potential RSTD is described, however, the power lines DL1-1, DL2-1, and DL3-1 can be set to the second power-supply potential PXVDD, the power lines DL1-2, DL2-2, and DL3-2 can be set to the reference potential PXVSS, and the power lines DL1-3, DL2-3, and DL3-3 can be set to the first power-supply potential RSTD. Alternatively, the power lines DL1-1, DL2-1, and DL3-1 can be set to the second power-supply potential PXVDD, the power lines DL1-2, DL2-2, and DL3-2 can be set to the first power-supply potential RSTD, and the power lines DL1-3, DL2-3, and DL3-3 can be set to the reference potential PXVSS.

Figure 7:
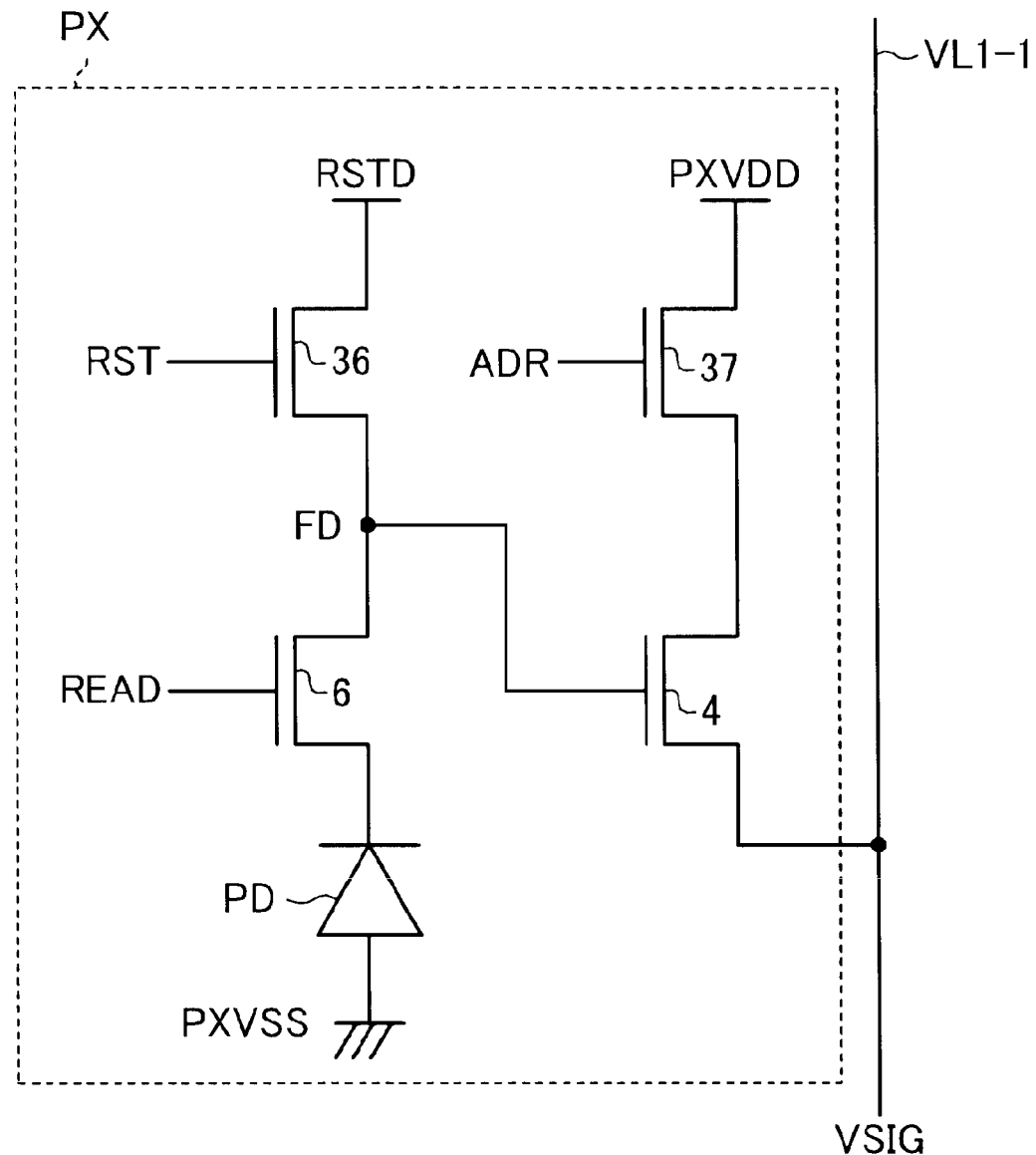
FIG. 7 is a circuit diagram which illustrates a schematic configuration of pixels in FIG. 6.

FIG. 7 is a circuit diagram which illustrates a schematic configuration of the pixels in FIG. 6.

In the pixels shown in FIG. 2, the drain of the resetting transistor 7 and the drain of the addressing transistor 5 are connected to the power-supply potential VDD. However, in the pixels in FIG. 7, the drain of the resetting transistor 36 is connected to the first power-supply potential RSTD, and the drain of the addressing transistor 37 is connected to the second power-supply potential PXVDD. In this arrangement, when setting the first power-supply potential RSTD to be higher than the second power-supply potential PXVDD, it is possible to make voltage amplitude of the floating diffusion FD larger when performing reset or read, thus increasing the dynamic range.

Fifth Embodiment

Figure 8:
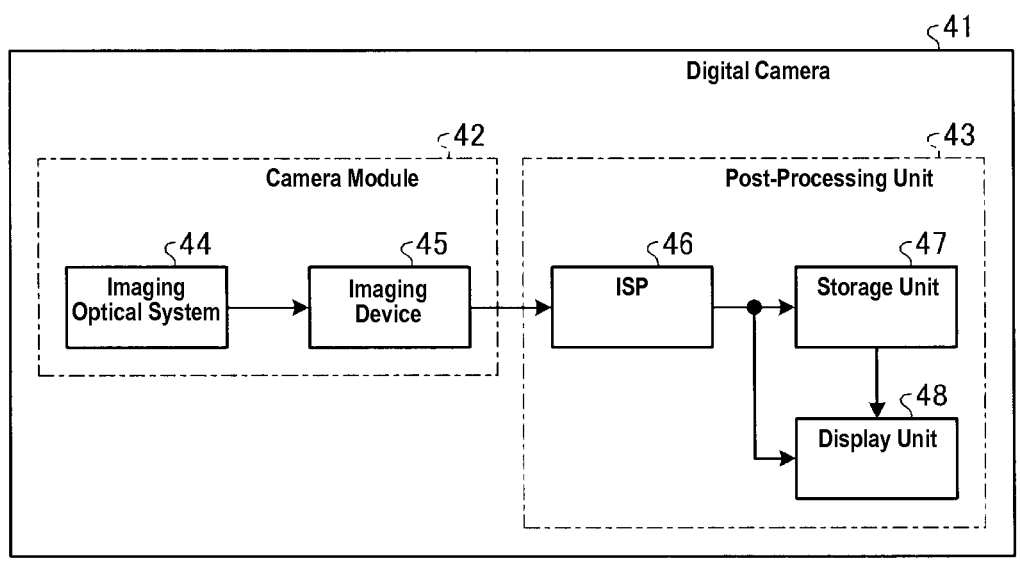
FIG. 8 is a block diagram which illustrates a schematic configuration of a digital camera to which a solid-state imaging device according to a fifth embodiment is applied.

FIG. 8 is a block diagram which illustrates a schematic configuration of a digital camera to which a solid-state imaging device according to a fifth embodiment is applied.

In FIG. 8, a digital camera 41 includes a camera module 42 and a post processing unit 43. The camera module 42 includes an imaging optical system 44 and a solid-state imaging device 45. The post processing unit 43 includes an image signal processor (ISP) 46, a storage unit 47, and a display unit 48. In addition, the solid-state imaging device 45 may adopt the configuration shown in FIG. 1, 4, 5, or 6. In addition, at least a part of the configuration of the ISP 46 may be formed by one chip along with the solid-state imaging device 45.

The imaging optical system 44 forms an object image by taking in light from an object. The solid-state imaging device 45 captures an object image. The ISP 46 performs signal processing of image signals that are captured by the solid-state imaging device 45. The storage unit 47 stores an image that has been subject to the signal processing in the ISP 46. The storage unit 47 outputs image signals to the display unit 48 according to a user's operation, or the like. The display unit 48 displays an image according to image signals that are input from the ISP 46 or the storage unit 47. The display unit 48 is, for example, a liquid crystal display. In addition, the camera module 42 may be applied to an electronic apparatus such as a mobile terminal with a camera, for example, in addition to the digital camera 41.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
a plurality of pixels arranged in rows and columns;
a plurality of horizontal controlling lines, each one of the horizontal controlling lines connected to a single row of pixels;
a first and a second vertical signal line for each column of pixels, wherein the first vertical signal line is connected to a first group of pixels that are adjacent to each other in the column and the second vertical signal line is connected to a second group of pixels that are adjacent to each other in the column, the first and second groups each including at least two adjacent pixels in the column; and
an analog-to-digital (AD) conversion circuit configured to perform analog-to-digital conversions of pixel signals obtained from the plurality of pixels,
wherein the first vertical signal line for each column crosses the second vertical signal line for the same column between the first and second groups of pixels in the column.

2. The device according to claim 1, wherein the AD conversion circuit includes at least two AD conversion units for each column of pixels.

3. The device according to claim 2, wherein each of the AD conversion units for each column is electrically connected to a different vertical signal line for the column.

4. The device according to claim 1, further comprising: a vertical scanning circuit configured to activate at least two horizontal controlling lines in the plurality of horizontal controlling lines at the same time.

5. The device according to claim 4, wherein the AD conversion circuit performs analog-to-digital conversions of the pixel signals read from pixels connected to the at least two horizontal controlling lines activated by the vertical scanning circuit.

6. The device according to claim 1, wherein each pixel includes:
a photodiode, a floating diffusion, and a reset gate connected in series between a first potential and a second potential; and
a read-out circuit connected to the floating diffusion and between the second potential and one vertical signal line.

7. A solid-state imaging device comprising:
a plurality of pixels that are arranged in a matrix having rows and columns;
a plurality of horizontal controlling lines each selecting pixels of a single row;
a plurality n of vertical signal lines for each column of the pixels, wherein n is at least two and each of the n vertical signal lines of the same column is connected to a different group of pixels of the same column;
a plurality n+1 of power lines for each column, wherein each of the power lines of the same column is connected to all of the pixels in the same column; and
an AD conversion circuit configured to perform analog-to-digital (AD) conversions of pixel signals obtained from pixels selected by horizontal controlling lines and read through the vertical signal lines, wherein
in each column, two of the power lines cross each other between adjacent groups of two pixels.

8. The device according to claim 7, wherein the AD conversion circuit includes a different AD conversion unit for each of the n vertical signal lines for each of the columns of pixels.

9. The device according to claim 8, wherein each AD conversion unit is electrically connected to a different one of the n vertical signal lines of the same column.

10. The device according to claim 7, further comprising:
a vertical scanning circuit configured to activate n horizontal controlling lines at the same time.

11. The device according to claim 10, wherein the AD conversion circuit performs analog-to-digital conversions of pixel signals read from the pixels connected to the n horizontal controlling lines that have been activated.

12. The device according to claim 7,
wherein each pixel includes a photodiode, a floating diffusion, and a reset gate connected in series between a first potential and a second potential; and
a read-out circuit connected to the floating diffusion and between a third potential and one vertical signal line.

13. A method for operating a solid-state imaging device that includes a plurality of pixels arranged in rows and columns, a plurality of horizontal controlling lines each connected to pixels of a single row, and a plurality of vertical signal lines for each column of pixels, wherein each column of pixels has at least two vertical signal lines connected thereto, each vertical signal line being connected to a different group of pixels in the column, the method comprising:
activating the plurality of vertical signal lines for a column, the plurality of vertical signal lines for the column crossing each other between adjacent groups of pixels, each group including at least two adjacent pixels;
activating a set of at least two horizontal controlling lines, each horizontal controlling line in the set being connected to pixels in different groups; and
simultaneously converting signals from pixels in the column that are connected to the set of horizontal controlling lines that have been activated, the signals being converted to a digital value.

14. The method according to claim 13, wherein the adjacent groups each have only two pixels.

15. The method according to claim 13, wherein the solid-state imaging device further includes an analog-to-digital (AD) conversion circuit having at least two AD conversion units for each of the columns of pixels, and each AD conversion unit for a column is electrically connected to a different vertical signal line in the same column.

16. The method according to claim 15, further comprising:
   activating a different set of at least two horizontal controlling lines.

17. The method according to claim 16, wherein the AD conversion units convert signals from the pixels in the column connected to the set of horizontal controlling lines that have been previously activated while the different set of horizontal controlling lines is activated.

\* \* \* \* \*